United States Patent [19]
Fujiki et al.

[11] Patent Number: 5,510,653
[45] Date of Patent: Apr. 23, 1996

[54] SEMICONDUCTOR DEVICE INCLUDING SILICON LADDER RESIN LAYER

[75] Inventors: Noriaki Fujiki; Shigeru Harada; Hiroshi Adachi; Etsushi Adachi, all of Hyogo, Japan

[73] Assignee: Mitsubishi Denki Kabushiki Kaisha, Tokyo, Japan

[21] Appl. No.: 40,968

[22] Filed: Mar. 31, 1993

[30] Foreign Application Priority Data

May 25, 1992 [JP] Japan ................... 4-132580

[51] Int. Cl.$^6$ ................... H01L 21/56; H01L 21/90
[52] U.S. Cl. ................... 257/759; 257/638; 257/760
[58] Field of Search ................... 257/759, 760, 257/787, 369, 635, 637, 638, 644, 790, 795, 377, 640

[56] References Cited

U.S. PATENT DOCUMENTS

| | | | |
|---|---|---|---|
| 4,349,609 | 9/1982 | Takeda et al. | 428/429 |
| 5,177,588 | 1/1993 | Ii et al. | 257/640 |

FOREIGN PATENT DOCUMENTS

| | | | |
|---|---|---|---|
| 0021818A1 | 7/1981 | European Pat. Off. . | |
| 3805490 | 9/1988 | Germany | 257/790 |
| 4140180A1 | 12/1992 | Germany . | |
| 0107523 | 6/1984 | Japan | 257/787 |
| 0143649 | 7/1985 | Japan | 257/759 |
| 62-299843 | 12/1987 | Japan . | |
| 63-231331 | 9/1988 | Japan . | |
| 2101764 | 4/1990 | Japan | 257/787 |

*Primary Examiner*—Rolf Hille
*Assistant Examiner*—Alexander Oscar Williams
*Attorney, Agent, or Firm*—Lowe, Price, LeBlanc & Becker

[57] ABSTRACT

Disclosed herein is a semiconductor device having a multilayer interconnection structure, which is provided with a plurality of via holes having constant diameters. Patterns of a first interconnection layer are provided on a semiconductor substrate. An interlayer insulating film is provided over the semiconductor substrate, to cover the patterns of the first interconnection layer. A silicon ladder resin film is applied onto the surface of the interlayer insulating film, to flatten the same. First and second via holes are provided through the silicon ladder resin film and the interlayer insulating film, to expose first and second coupling portions provided on the surfaces of the patterns of the first interconnection layer. A second interconnection layer is provided over the semiconductor substrate, to be connected with the first and second coupling portions through the first and second via holes respectively.

16 Claims, 15 Drawing Sheets

SEMICONDUCTOR DEVICE INCLUDING SILICON LADDER RESIN LAYER

BACKGROUND OF THE INVENTION

1. Field of the Invention

The present invention generally relates to a semiconductor device, and more specifically, it relates to a semiconductor device which has a multilayer interconnection structure. The present invention also relates to a method of fabricating such a semiconductor device.

2. Description of the Background Art

FIG. 12 is a sectional view showing a conventional semiconductor device having a multilayer interconnection structure.

Field oxide films 7 are formed on a major surface of a silicon substrate 1, and gate electrode wires 6 are provided on the field oxide films 7. A first interlayer insulating film 8 is formed on the silicon substrate 1, to cover the gate electrode wires 6. Patterns 9a, 9b and 9c of a first aluminum interconnection layer are formed on the first interlayer insulating film 8. A second interlayer insulating film 10 is provided to cover the patterns 9a, 9b and 9c of the first aluminum interconnection layer. The second interlayer insulating film 10 is provided therein with first and second via holes 10a and 10b for exposing first and second coupling portions 90a and 90b of the patterns 9a and 9b of the first aluminum interconnection layer respectively. A second aluminum interconnection layer 12 is provided to be connected with the first and second coupling portions 90a and 90b through the first and second via holes 10a and 10b respectively. A passivation film 13 is provided over the silicon substrate 1, to cover the second aluminum interconnection layer 12.

A method of fabricating the conventional semiconductor device shown in FIG. 12 is now described.

FIGS. 13 to 17 are sectional views showing steps in the method of fabricating the conventional semiconductor device in due order.

Referring to FIG. 13, field oxide films 7 are formed on a major surface of a silicon substrate 1, and then gate electrode wires 6 are formed on the field oxide films 7. A first interlayer insulating film 8 is formed on the silicon substrate 1, to cover the gate electrode wires 6. Patterns 9a, 9b and 9c of a first aluminum interconnection layer are formed on the first interlayer insulating film 8, and a second interlayer insulating film 10 is formed to cover these patterns 9a, 9b and 9c. The second interlayer insulating film 10 is obtained by forming a silicon oxide film over the silicon substrate 1 by plasma CVD, then forming an inorganic coating/insulating film thereon by rotation coating, and thereafter etching back these films by dry etching. The inorganic coating/insulating film is prepared from a spin-on glass film (SOG film).

Referring to FIG. 14, a resist film 22 is applied onto the second interlayer insulating film 10. Then the resist film 22 is so patterned as to define first and second openings 22a and 22b in regions to be provided with first and second via holes for exposing first and second coupling portions of the patterns 9a and 9b of the first aluminum interconnection layer respectively.

Referring to FIG. 15, the patterned resist film 22 is used as a mask to selectively etch the second interlayer insulating film 10 by reactive ion etching, for example, thereby forming first and second via holes 10a and 10b. Thereafter the resist film 22 is removed by oxygen plasma or the like, as shown in FIGS. 15 and 16.

Referring to FIG. 17, an aluminum film is formed entirely over the surface of the second interlayer insulating film 10 by sputtering, for example, to fill up the first and second via holes 10a and 10b. Thereafter this aluminum film is patterned by photolithography and reactive ion etching, thereby forming patterns of a second aluminum interconnection layer 12. A silicon nitride film for defining a passivation film 13 is formed entirely over the surface of the silicon substrate 1 by plasma CVD, to cover the patterns of the second aluminum interconnection layer 12. Thereafter openings (not shown) are formed in the passivation film 13 for exposing bonding pads, which in turn are connected with bonding wires to complete the steps of fabricating the semiconductor device.

In the aforementioned conventional method of fabricating a semiconductor device having a multilayer interconnection structure, however, the following problem has remarkably arisen with layer multiplication and refinement of the interconnection structure:

Due to refinement of the interconnection structure, i.e., reduction of the interconnection width, it is necessary to reduce via holes in diameter. Consequently, it is difficult to form patterns for the via holes. This problem is now described in more detail with reference to FIG. 18. Referring to FIG. 18, a resist film 22 is provided therein with first and second openings 22a and 22b for defining two via holes. The first and second openings 22a and 22b are adapted to define first and second via holes for exposing coupling portions of patterns 9a and 9b of a first aluminum interconnection layer respectively.

The first opening 22a is formed in a region for defining the first via hole, i.e., a portion where a field oxide film 7, a gate electrode wire 6a and the pattern 9a of the first aluminum interconnection layer are overlapped with each other. On the other hand, the second opening 22b is formed on a region which is provided with only the pattern 9b of the first aluminum interconnection layer. In other words, the first opening 22a is formed on a projecting portion of an interlayer insulating film 10, while the second opening 22b is formed on a depressed portion thereof. Namely, a distance $a_3$ is greater than a distance $b_3$ in FIG. 18.

When the resist film 22 is applied onto the interlayer insulating film 10 containing such a step, its thickness is relatively reduced on the projecting portion and relatively increased on the depressed portion. In other words, a distance $a_4$ is less than a distance $b_4$ in FIG. 18. If the resist film 22 is patterned by photolithography in such a state, a diameter $a_2$ is inevitably greater than a diameter $b_2$ in FIG. 18 at the bottoms of the resist patterns, although a diameter $a_1$ is equal to a diameter $b_1$ at the tops thereof.

The reason for this is now described with reference to FIGS. 19, 20 and 21.

FIG. 19 illustrates optimum focal positions of respective portions in a resist film 22 being formed on an interlayer insulating film 10 which has a step. Symbols a and b denote the optimum focal positions of portions A and B of the resist film 22 having small and large thicknesses respectively. When the respective portions A and B are brought into focus to expose the resist film 22, it is possible to obtain first and second openings 22a and 22b having the same diameters. In general, however, only one of the portions A and B is brought into focus to expose the resist film 22.

If the portion A is brought into focus, the second opening 22b is incompletely defined in the portion B, as shown in FIG. 20. If the portion B is brought into focus, on the other hand, the first opening 22a is too much increased in diameter in the portion A, as shown in FIG. 21.

Referring again to FIG. 18, the first and second openings 22a and 22b differ in sectional form from each other for the aforementioned reason. When the second interlayer insulating film 10 is etched through the resist film 22 having such a sectional form, a second via hole 10b is incompletely defined as shown in FIG. 22, although a first via hole 10a is completely defined. Due to such incomplete opening of the second via hole 10b, a second aluminum interconnection layer 12 is not electrically connected with the pattern 9b of the first aluminum interconnection layer.

With layer multiplication of the interconnection structure, the aforementioned problem has remarkably arisen as the step is increased, due to the irregular surface of the interlayer insulating film.

SUMMARY OF THE INVENTION

An object of the present invention is to provide a semiconductor device which has a reliable multilayer interconnection structure.

Another object of the present invention is to provide a semiconductor device having a multilayer interconnection structure, which is provided with a plurality of via holes with constant diameters.

Still another object of the present invention is to provide a method of fabricating a highly reliable semiconductor device by flattening the surface of an interlayer insulating film.

A further object of the present invention is, in relation to a method of fabricating a semiconductor device having a plurality of via holes, to provide a method of supplying the via holes with constant diameters.

A semiconductor device according to a first aspect of the present invention comprises a semiconductor substrate, and a first interconnection layer being provided on the semiconductor substrate and having first and second coupling portions. An interlayer insulating film is provided over the semiconductor substrate, to cover the first interconnection layer. In order to flatten the surface of the interlayer insulating film, a film of silicon ladder resin which is expressed in the following general formula is applied onto the surface of the interlayer insulating film:

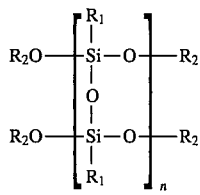

where $R_1$ represents similar or dissimilar phenyl radicals or lower alkyl radicals, $R_2$ represents similar or dissimilar hydrogen atoms or lower alkyl radicals, and n represents an integer of 20 to 1000.

First and second via holes are provided through the silicon ladder resin film and the interlayer insulating film for exposing first and second coupling portions which are provided on the surface of the first interconnection layer respectively. A second interconnection layer is provided over the semiconductor substrate to be connected with the first and second coupling portions through the first and second via holes.

In a method of fabricating a semiconductor device according to a second aspect of the present invention, a first interconnection layer having first and second coupling portions is formed on a semiconductor substrate. An interlayer insulating film is formed over the semiconductor substrate, to cover the first interconnection layer. A film of silicon ladder resin which is expressed in the following general formula is applied entirely over the upper surface of the interlayer insulating film, thereby flattening the surface of the interlayer insulating film:

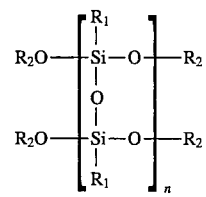

where $R_1$ represents similar or dissimilar phenyl radicals or lower alkyl radicals, $R_2$ represents similar or dissimilar hydrogen atoms or lower alkyl radicals, and n represents an integer of 20 to 1000.

A resist film is applied entirely over the upper surface of the silicon ladder resin film. The resist film is so patterned as to form first and second openings in regions to be provided with first and second via holes for exposing the first and second coupling portions which are provided on the surface of the first interconnection layer respectively. The patterned resist film is used to selectively etch the interlayer insulating film, thereby forming the first and second via holes in the interlayer insulating film. Thereafter the resist film is removed. A second interconnection layer is formed over the semiconductor substrate, to be connected with the first and second coupling portions of the first interconnection layer through the first and second via holes.

In a method of fabricating a semiconductor device according to the present invention, a first interconnection layer having first and second coupling portions is formed on a semiconductor substrate. An interlayer insulating film is formed over the semiconductor substrate, to cover the first interconnection layer. A film of silicon ladder resin which is expressed in the following general formula is applied onto the overall upper surface of the interlayer insulating film, thereby flattening the surface of the interlayer insulating film:

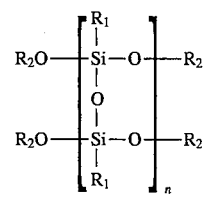

where $R_1$ represents similar or dissimilar phenyl radicals or lower alkyl radicals, $R_2$ represents similar or dissimilar hydrogen atoms or lower alkyl radicals, and n represents an integer of 20 to 1000.

Then, a resist film is applied onto the overall upper surface of the silicon ladder resin film. The resist film is so patterned as to form first and second openings in regions to be provided with first and second via holes for exposing the first and second coupling portions which are provided on the surface of the first interconnection layer respectively. The patterned resist film is used to selectively etch the interlayer insulating film, thereby forming the first and second via holes in the interlayer insulating film. Then the resist film is removed. Thereafter the silicon ladder resin film is removed. A second interconnection layer is formed over the semiconductor substrate, to be connected with the first and second coupling portions of the first interconnection layer through the first and second via holes.

In the semiconductor device according to the first aspect of the present invention, the surface of the interlayer insulating film is flattened by the silicon ladder resin film. This silicon ladder resin film is formed in a large thickness to sufficiently flatten the surface of the interlayer insulating film, since the silicon ladder resin film causes no cracking even if the same is increased in thickness. Consequently, the first and second via holes have constant diameters, to improve the semiconductor device in reliability.

In the method of fabricating a semiconductor device according to the second aspect of the present invention, the surface of the interlayer insulating film is flattened by the film of the silicon ladder resin which is expressed in the aforementioned structural formula. The silicon ladder resin film causes no cracking even if the same is increased in thickness. Therefore, it is possible to sufficiently flatten the surface of the interlayer insulating film by forming the silicon ladder resin film thereon in a large thickness. Consequently, it is possible to provide the first and second via holes, which are formed in the interlayer insulating film, with constant diameters.

In the method of fabricating a semiconductor device according to the third aspect of the present invention, the silicon ladder resin film is removed before formation of the second interconnection layer. Thus, the first and second via holes have substantially uniform depths. Therefore, the second interconnection layer can be easily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
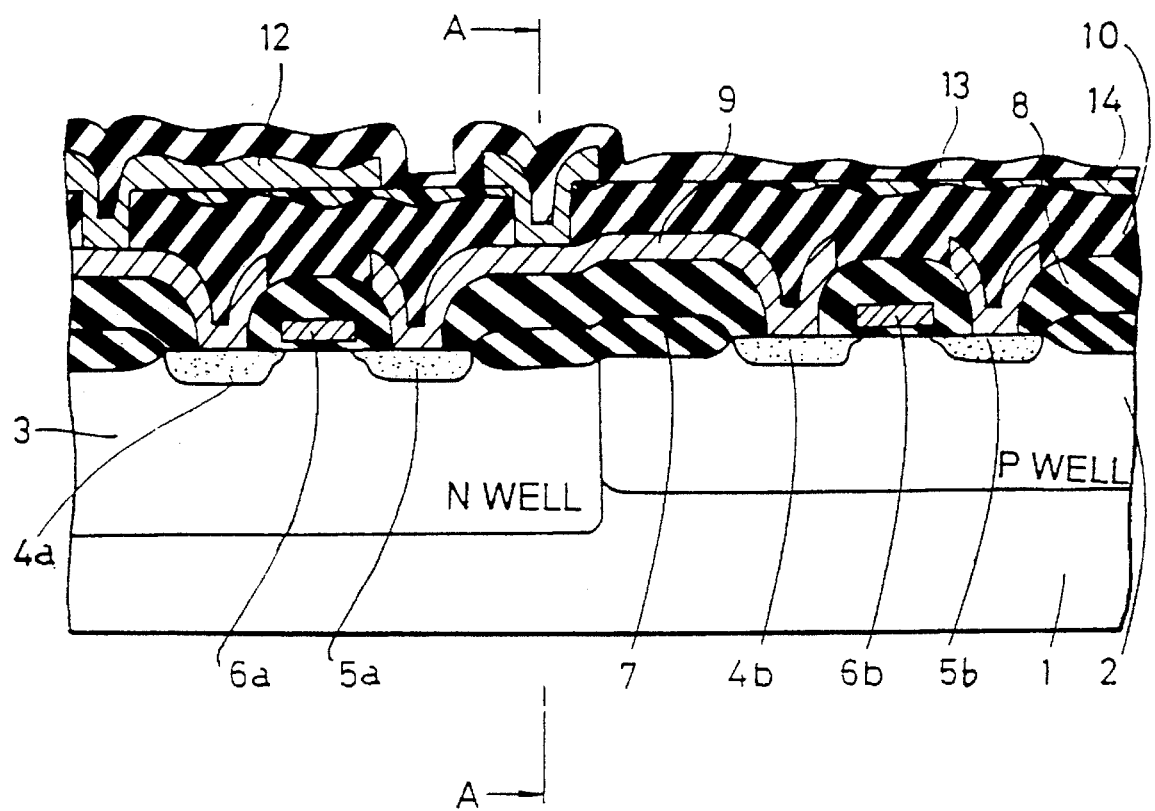
FIG. 1 is a sectional view showing a semiconductor device according to a first embodiment of the present invention.
Figure 2:
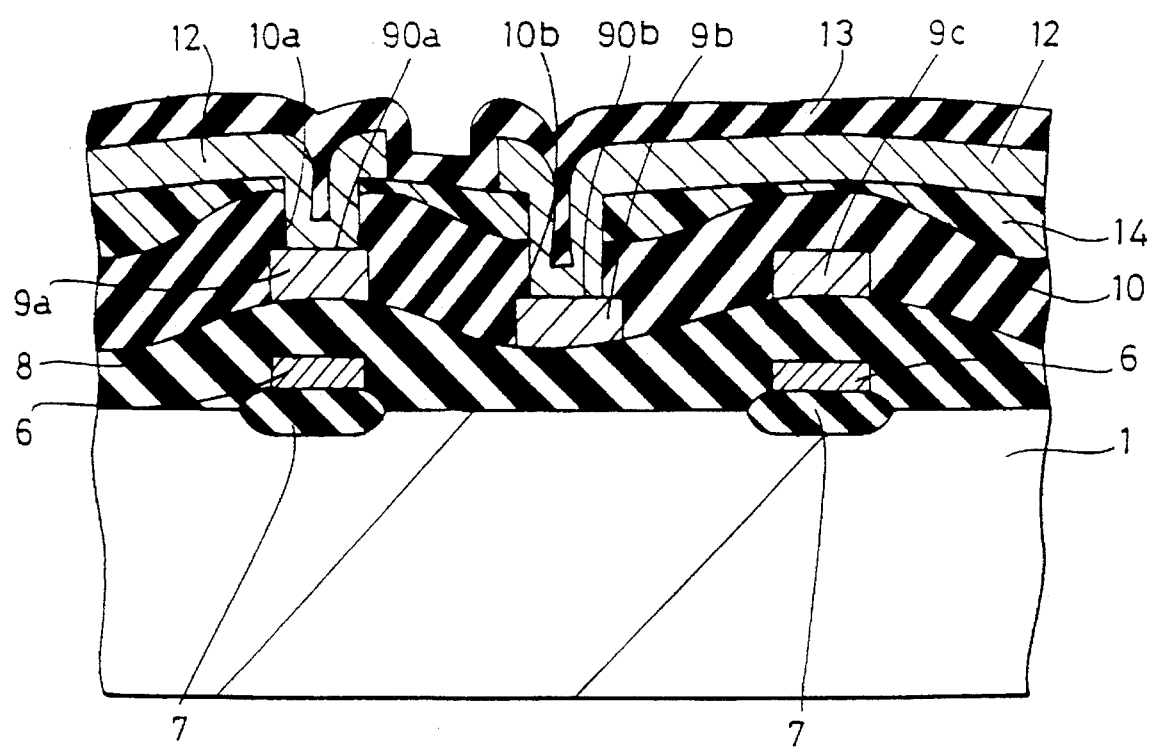
FIG. 2 is a sectional view taken along the line A—A in FIG. 1.

FIG. 1 is a local sectional view showing a semiconductor device to which the present invention is applied. In the portion shown in FIG. 1, a CMOS inverter is formed by two MOS transistors. FIG. 2 is a sectional view taken along the line A—A in FIG. 1. Referring to FIGS. 1 and 2, a p-type well diffusion layer 2 and an n-type well diffusion layer 3 are provided on a major surface of a p-type silicon substrate 1. A source 4b and a drain 5b, which are n-type diffusion layers, are provided on a major surface of the p-type well diffusion layer 2. A gate electrode wire 6b is provided above the p-type well diffusion layer 2 through a gate oxide film, thereby forming a p-channel transistor.

A source 4a and a drain 5a, which are p-type diffusion layers, are provided on a major surface of the n-type well diffusion layer 3. A gate electrode wire 6a is formed above the n-type well diffusion layer 3 through a gate oxide film, thereby forming an n-channel transistor. The n-channel transistor is isolated from the p-channel transistor by a field oxide film 7. A first interlayer insulating film 8 is applied onto the silicon substrate 1, to cover the gate electrode wires 6a and 6b. The drain 5a of the n-channel transistor is electrically connected with the source 4b of the p-channel transistor by a first aluminum interconnection layer 9 through a contact hole. A second interlayer insulating film 10 is applied onto the silicon substrate 1, to cover the first aluminum interconnection layer 9. A film 14 of silicon ladder resin, which is expressed in the following general formula, is applied to the surface of the second interlayer insulating film 10, in order to flatten the same:

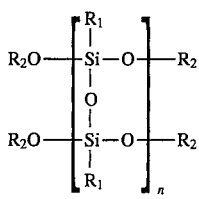

where $R_1$ represents similar or dissimilar phenyl radicals or lower alkyl radicals, $R_2$ represents similar or dissimilar hydrogen atoms or lower alkyl radicals, and n represents an integer of 20 to 1000.

First and second via holes 10a and 10b are provided through the silicon ladder resin film 14 and the second interlayer insulating film 10 for exposing first and second coupling portions 90a and 90b of patterns 9a and 9b of the first aluminum interconnection layer 9. A second aluminum interconnection layer 12 is provided to be connected with the first and second coupling portions 90a and 90b through the first and second via holes 10a and 10b respectively. A passivation film 13 is provided over the silicon substrate 1, to cover the second aluminum interconnection layer 12. According to this embodiment, the first via hole 10a is substantially equal in diameter to the second via hole 10b. Further, the distance between the upper end portion of the first via hole 10a and the major surface of the silicon substrate 1 is substantially equal to that between the upper end portion of the second via hole 10b and the major surface of the silicon substrate 1.

A method of fabricating the semiconductor device shown in FIG. 2 is now described.

FIGS. 3 to 7 are local sectional views showing steps in the method of fabricating the semiconductor device shown in FIG. 2 in due order.

Figure 3:
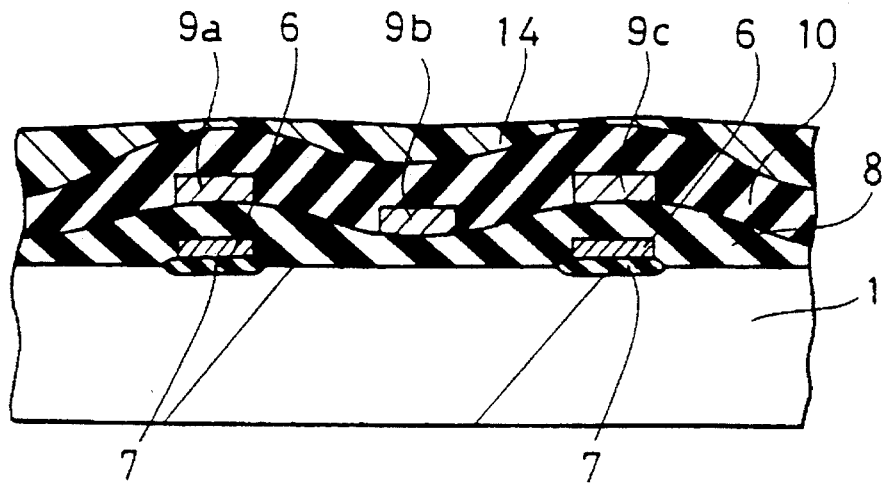
FIG. 3 is a local sectional view showing a first step in a method of fabricating a semiconductor device according to the first embodiment of the present invention.

Referring to FIG. 3, field oxide films 7 are formed on a major surface of a silicon substrate 1, and gate electrode wires 6 are formed on the field oxide films 7. A first interlayer insulating film 8 is formed over the silicon substrate 1, to cover the gate electrode wires 6. Patterns 9a, 9b and 9c of a first aluminum interconnection layer are formed on the first interlayer insulating film 8. A second interlayer insulating film 10 is formed on the first interlayer insulating film 8, to cover the patterns 9a, 9b and 9c of the first aluminum interconnection layer. Then, a film 14 of silicon ladder resin, which is expressed in the following general formula, is applied onto the overall upper surface of the second interlayer insulating film 10 by rotation coating, for example:

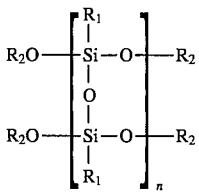

where $R_1$ represents similar or dissimilar phenyl radicals or lower alkyl radicals, $R_2$ represents similar or dissimilar hydrogen atoms or lower alkyl radicals, and n represents an integer of 20 to 1000.

The silicon ladder resin is prepared from polyphenyl silsesquioxane, polyphenylvinyl silsesquioxane, polyphenylmethyl silsesquioxane, polymethylvinyl silsesquioxane, polymethyl silsesquioxane, polyvinyl silsesquioxane or polyallyl silsesquioxane, for example. The silicon ladder resin film 14 is so applied onto the second interlayer insulating film 10 as to flatten its surface.

If the integer n is less than 2 in the above formula, the film forming property is deteriorated, while the wet etching property after film formation is deteriorated if the integer n exceeds 1000.

Then, the substance is baked at a temperature of 150° C., so that the solvent is evaporated. Thereafter the substance is again baked at a temperature exceeding 300° C., to be improved in insulability. If an inorganic coating/insulating film mainly composed of silanol ($Si(OH)_4$) is employed for the purpose of flattening, a film thickness of only 0.5 μm is attained at the most since the film is easily cracked due to its own contraction stress. On the other hand, the aforementioned silicon ladder resin film 14 can be formed in a thickness of at least 1.0 μm, since heat contraction of the silicon ladder resin is so small that no cracking is caused even if the thickness exceeds 1.0 μm. Thus, the silicon ladder resin film 14 can effectively flatten the surface of the second interlayer insulating film 10.

Figure 4:
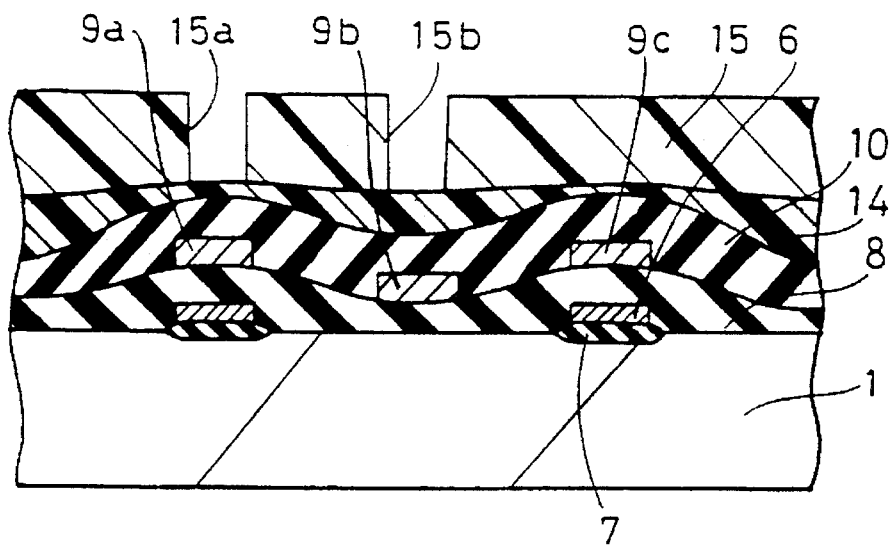
FIG. 4 is a local sectional view showing a second step in the method of fabricating a semiconductor device according to the first embodiment of the present invention.
Figure 5:
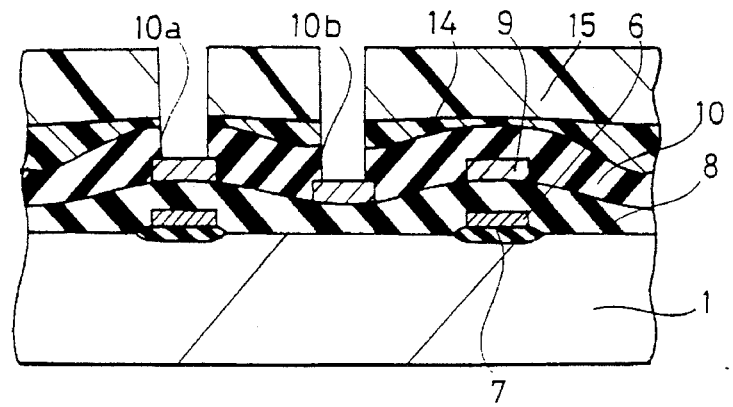
FIG. 5 is a local sectional view showing a third step in the method of fabricating a semiconductor device according to the first embodiment of the present invention.

Referring to FIG. 4, a resist film 15 is applied onto the overall upper surface of the silicon ladder resin film 14. Then the resist film 15 is so patterned by photolithography as to form first and second openings 15a and 15b in regions to be provided with first and second via holes for exposing first and second coupling portions provided on the surfaces of the patterns 9a and 9b of the first interconnection layer respectively.

At this time, the resist film 15 can be patterned in high accuracy, since the surface of the second interlayer insulating film 10 is flattened by the silicon ladder resin film 14 having excellent flattening ability.

Figure 8:
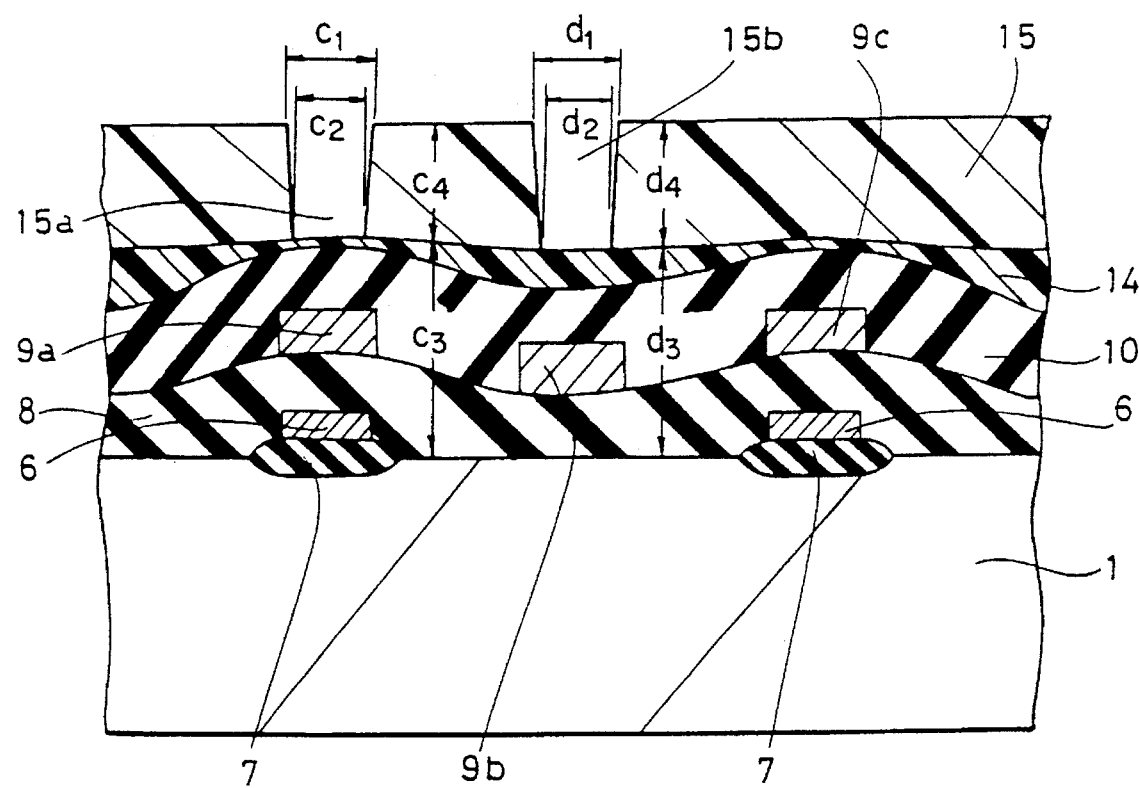
FIG. 8 is a diagram for illustrating the action of the present invention.

Capability of such high accuracy patterning is now described in more detail with reference to FIG. 8, which is an enlarged view corresponding to FIG. 4. Referring to FIG. 8, the first and second openings 15a and 15b are formed in the resist film 15. The first opening 15a is formed above a portion where the field oxide film 7, the gate electrode wire 6, the first interlayer insulating film 8 and the pattern 9a of the first aluminum interconnection layer are overlapped with each other. On the other hand, the second opening 15b is formed above a portion where only the pattern 9b of the first aluminum interconnection layer is provided on the first interlayer insulating film 8. Since the surface of the second interlayer insulating film 10 is sufficiently flattened by the silicon ladder resin film 14 being applied thereto, distances $c_3$ and $d_3$ appearing in FIG. 8 are substantially equal to each other. Therefore, the resist film 15 can be applied onto the overall upper surface of the flattened second interlayer insulating film 10 with a constant thickness. Also in the portions to be provided with the first and second openings 15a and 15b, distances $c_4$ and $d_4$ appearing in FIG. 8 are equal to each other. When the resist film 15 is patterned by photolithography, therefore, diameters $c_1$ and $d_1$ are equal to each other on the top portions of the resist patterns, while diameters $c_2$ and $d_2$ are also equal to each other at the bottom portions of the resist patterns. Thus, the resist film 15 can be patterned in high accuracy.

Referring again to FIG. 5, the patterned resist film 15 is used as a mask to etch the silicon ladder resin film 14 by RIE, for example. Then the second interlayer insulating film 10 is etched to form first and second via holes 10a and 10b.

Figure 6:
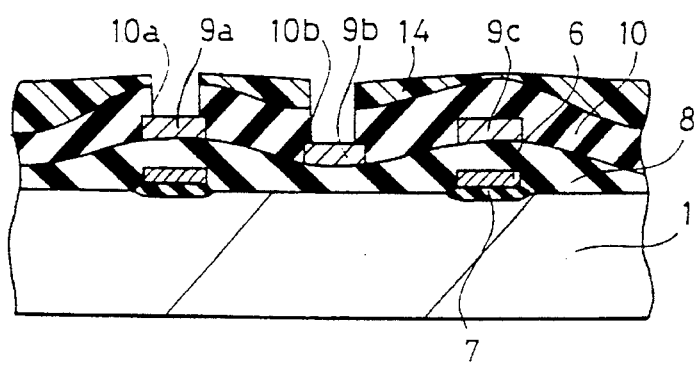
FIG. 6 is a local sectional view showing a fourth step in the method of fabricating a semiconductor device according to the first embodiment of the present invention.

Referring to FIG. 6, the resist film 15 is removed by oxygen plasma or the like.

Figure 7:
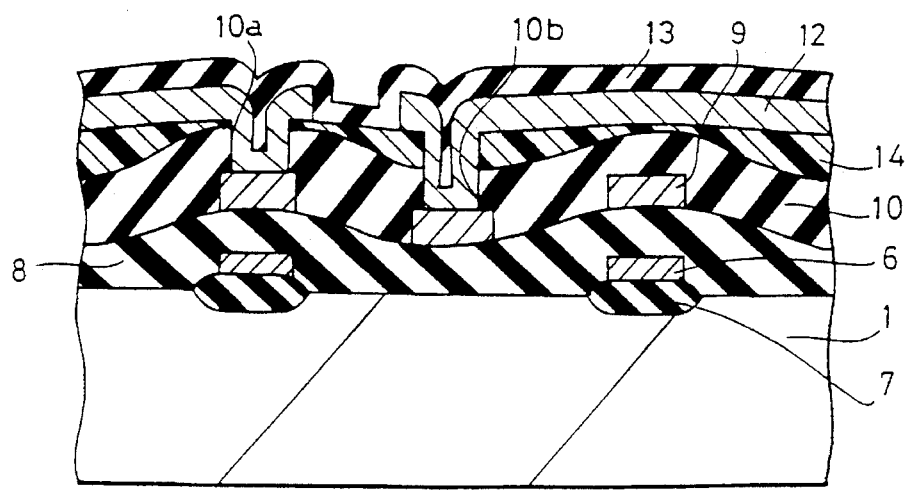
FIG. 7 is a local sectional view showing a fifth step in the method of fabricating a semiconductor device according to the first embodiment of the present invention.

Referring to FIG. 7, an aluminum alloy film is formed entirely over the upper surface of the silicon ladder resin film 14 by sputtering, for example, to fill up the first and second via holes 10a and 10b, and then this aluminum alloy film is patterned by photolithography or RIE, to form patterns of a second aluminum interconnection layer 12. Thereafter a passivation film 13 is formed over the silicon substrate 1, to cover the patterns of the second aluminum interconnection layer 12.

Second Embodiment

Although the second aluminum interconnection layer 12 is formed without removing the silicon ladder resin film 14 in the first embodiment as shown in FIG. 7, this silicon ladder resin film 14 can alternatively be removed after formation of the first and second via holes 10a and 10b.

Figure 9:
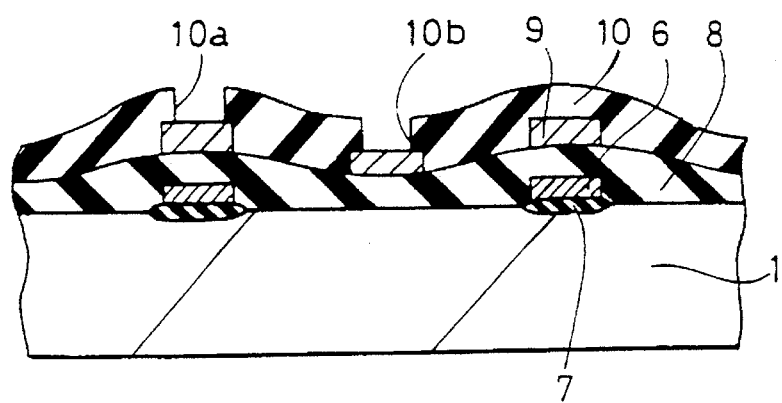
FIG. 9 is a local sectional view showing a first step in a method of fabricating a semiconductor device according to a second embodiment of the present invention.

Referring to FIG. 9, such a silicon ladder film is removed after steps corresponding to those shown in FIGS. 3 to 6. The silicon ladder resin film is removed by wet etching with a dilute hydrofluoric acid solution. When such a hydrofluoric acid solution is employed, the etching rate for the silicon ladder resin film is increased. Therefore, an etching selection ratio of the silicon ladder resin film to a second interlayer insulating film 10 is so increased that the silicon ladder resin film can be preferably removed. The silicon ladder resin film can alternatively be removed by dry etching, for example, so far as the same has a sufficient selection ratio.

Figure 10:
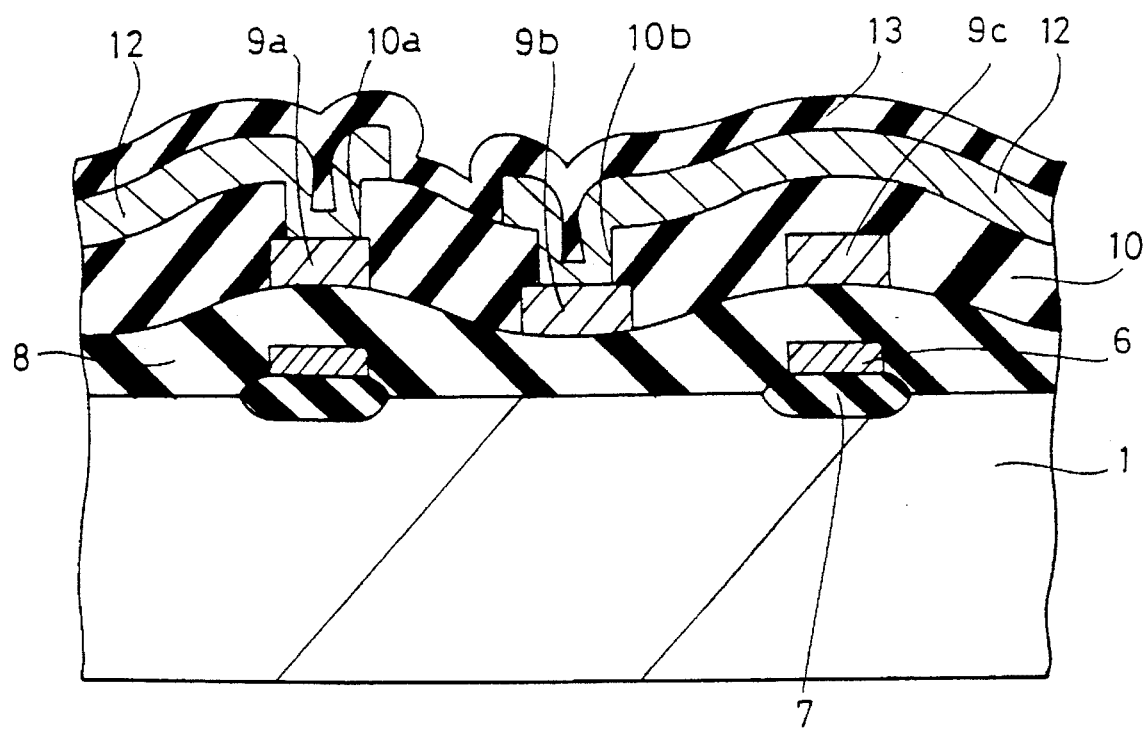
FIG. 10 is a local sectional view showing a second step in the method of fabricating a semiconductor device according to the second embodiment of the present invention.

When the silicon ladder resin film is entirely removed, first and second via holes 10a and 10b are substantially uniformalized in depth as shown in FIGS. 9 and 10, whereby a second aluminum interconnection layer 12 can be easily formed. If the via holes 10a and 10b have nonuniform depths, step coverage may be deteriorated when the second aluminum interconnection layer 12 is formed by sputtering, for example. When the via holes 10a and 10b are made uniform in depth, on the other hand, the second aluminum interconnection layer 12 uniformly fills up these via holes 10a and 10b. Thus, it is possible to obtain a semiconductor device having high reliability.

Third Embodiment

Although the interconnection layers are made of aluminum in the aforementioned embodiments, the present invention is not restricted to this. The interconnection layers may alternatively be made of a metal having a high melting point such as tungsten, titanium or molybdenum, a silicide thereof such as $WSi_2$, $TiSi_2$ or $MoSi_2$, or a polycrystalline silicon material.

Fourth Embodiment

Although the via holes are adapted to connect the first and second aluminum interconnection layers with each other in the aforementioned embodiments, the present invention is not restricted to this. The present invention may alternatively be applied to via holes for connecting second and third aluminum interconnection layers with each other as shown in FIG. 11, to attain an effect similar to those of the aforementioned embodiments.

Figure 11:
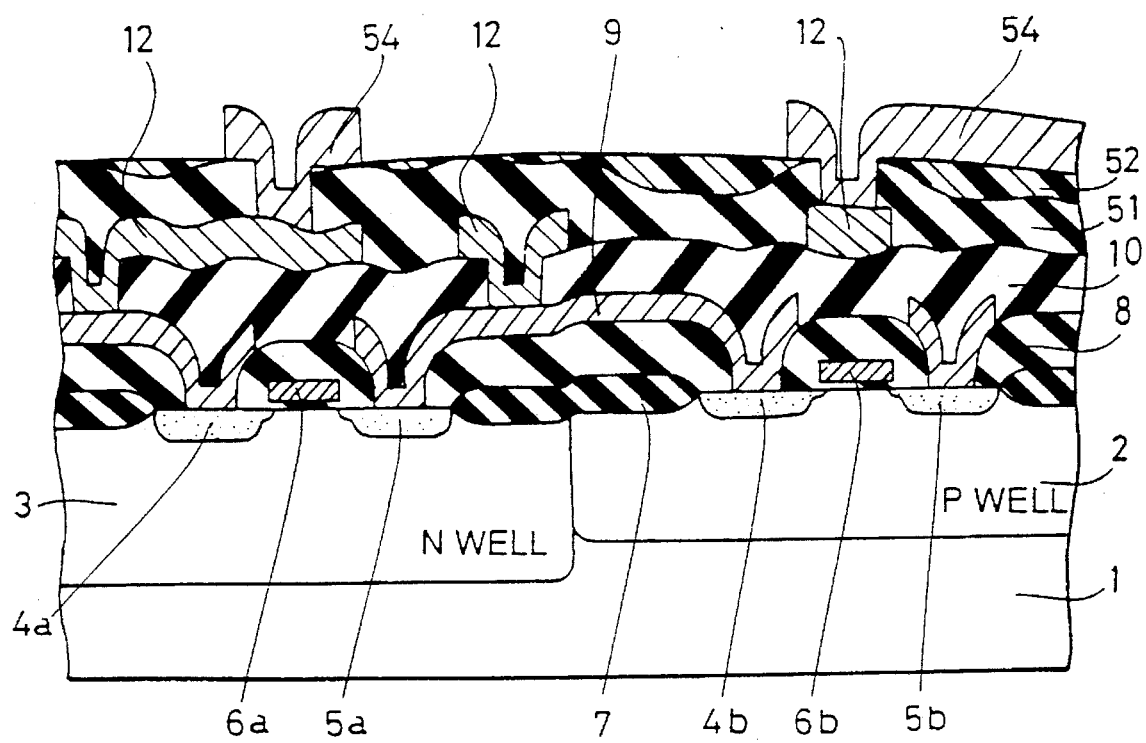
FIG. 11 is a sectional view showing a semiconductor device according to a third embodiment of the present invention.
Figure 12:
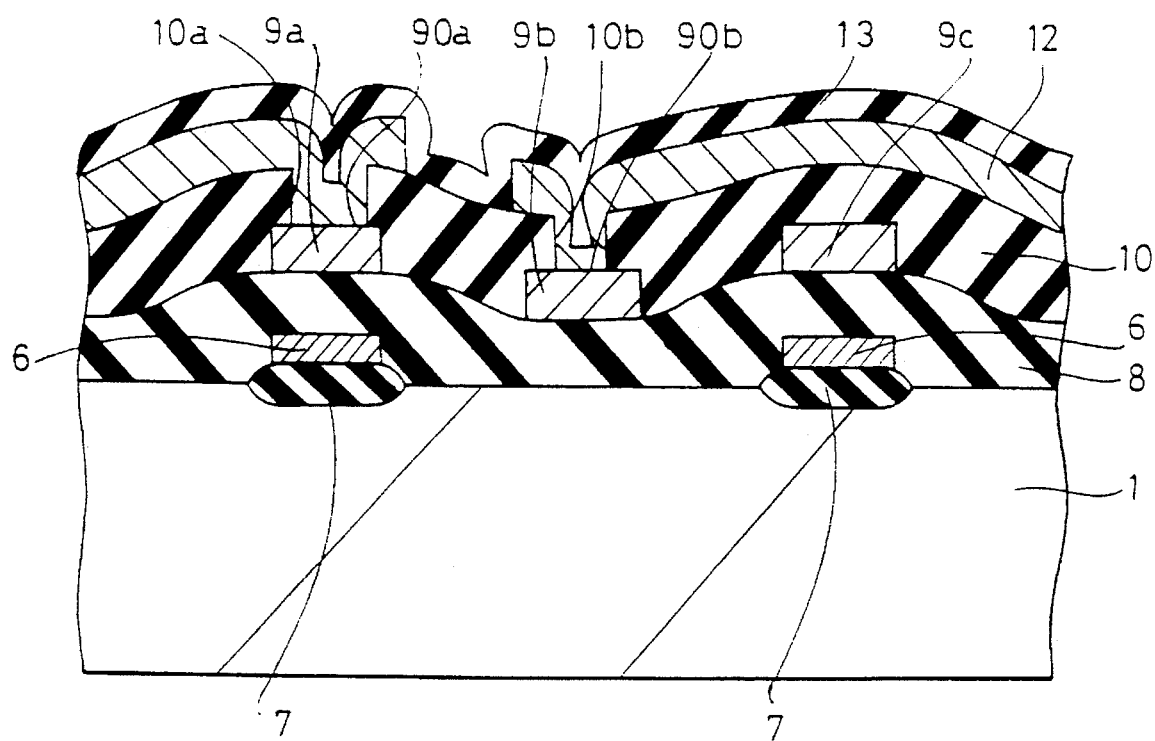
FIG. 12 is a sectional view showing a conventional semiconductor device.
Figure 13:
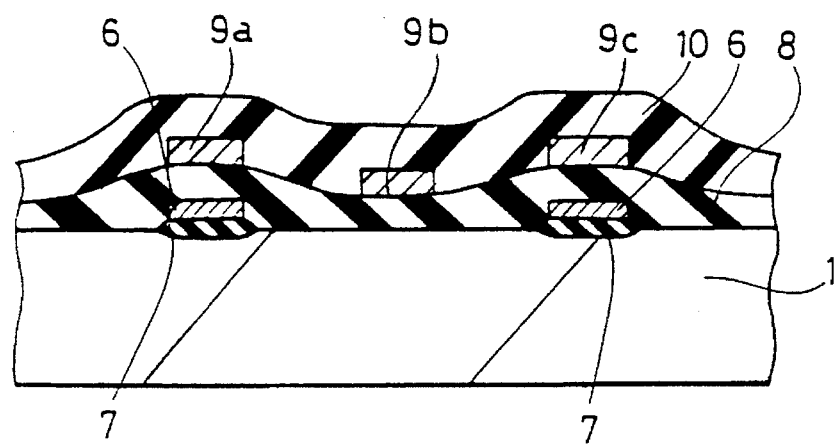
FIG. 13 is a local sectional view showing a first step in a conventional method of fabricating a semiconductor device.
Figure 14:
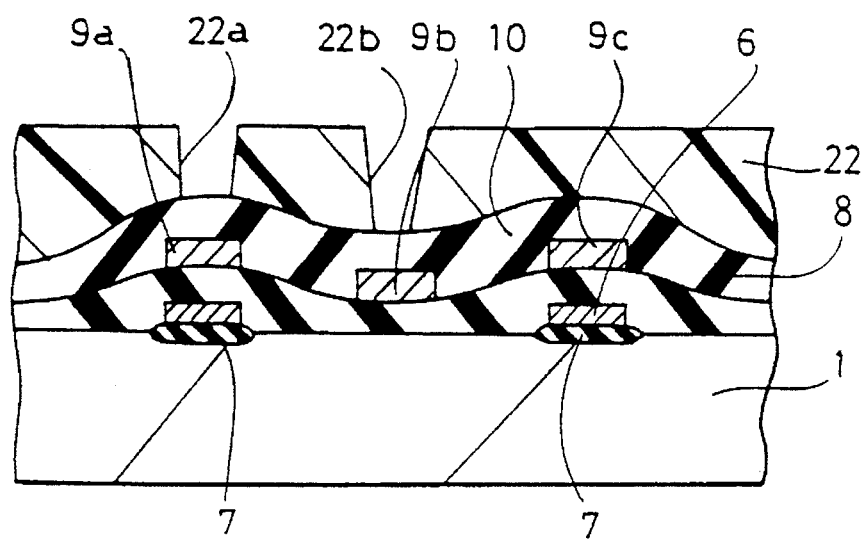
FIG. 14 is a local sectional view showing a second step in the conventional method of fabricating a semiconductor device.
Figure 15:
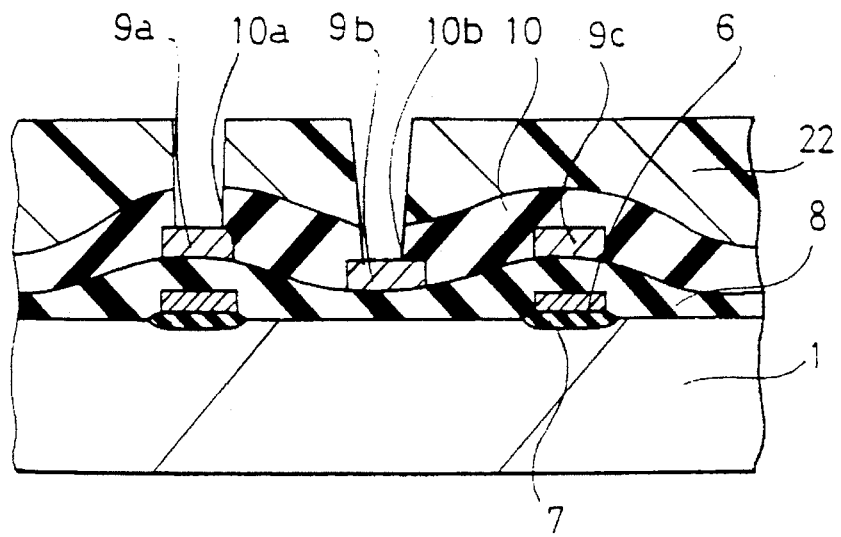
FIG. 15 is a local sectional view showing a third step in the conventional method of fabricating a semiconductor device.
Figure 16:
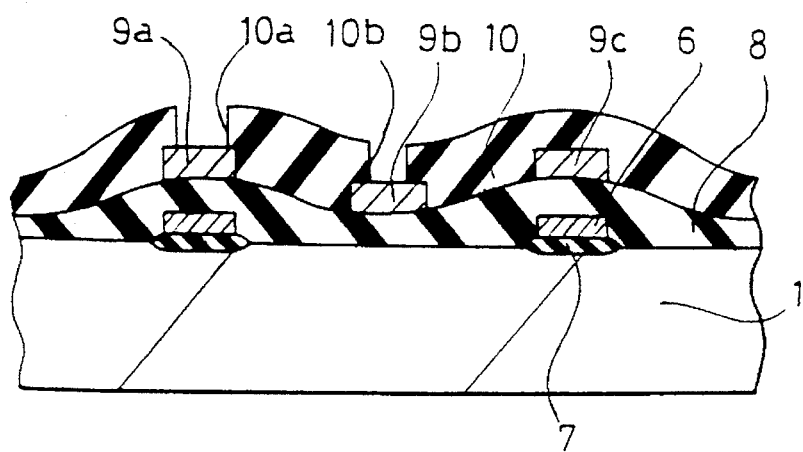
FIG. 16 is a local sectional view showing a fourth step in the conventional method of fabricating a semiconductor device.
Figure 17:
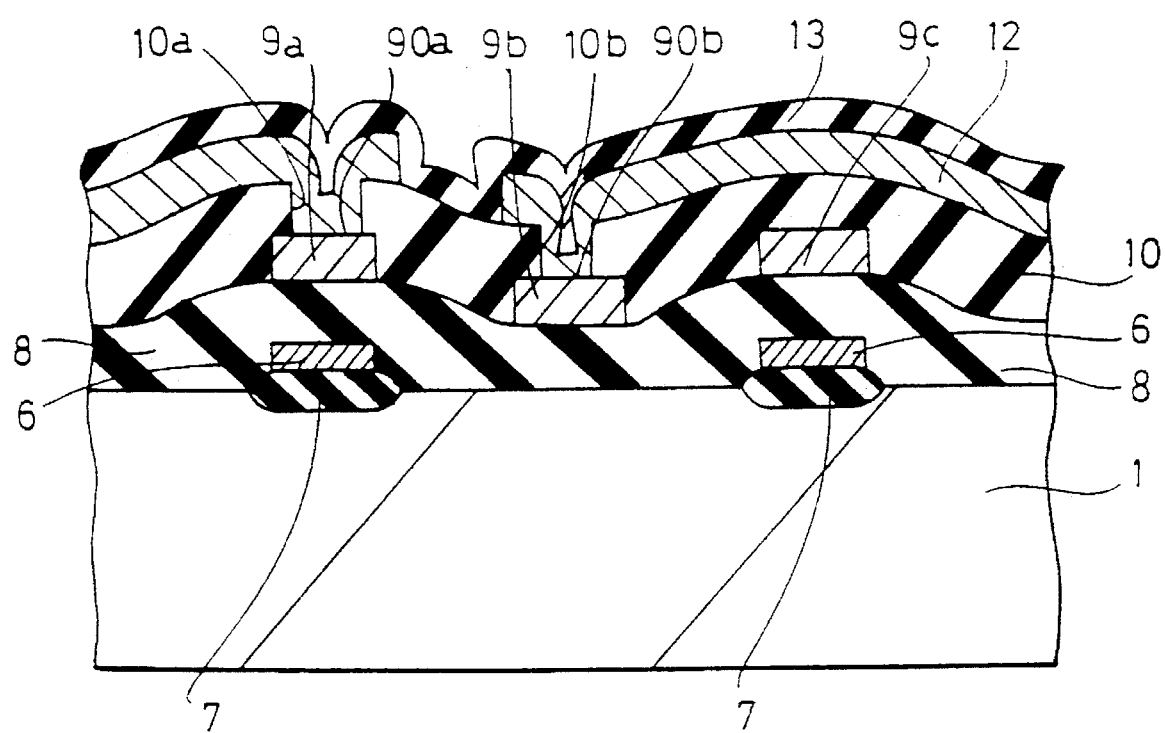
FIG. 17 is a local sectional view showing a fifth step in the conventional method of fabricating a semiconductor device.
Figure 18:
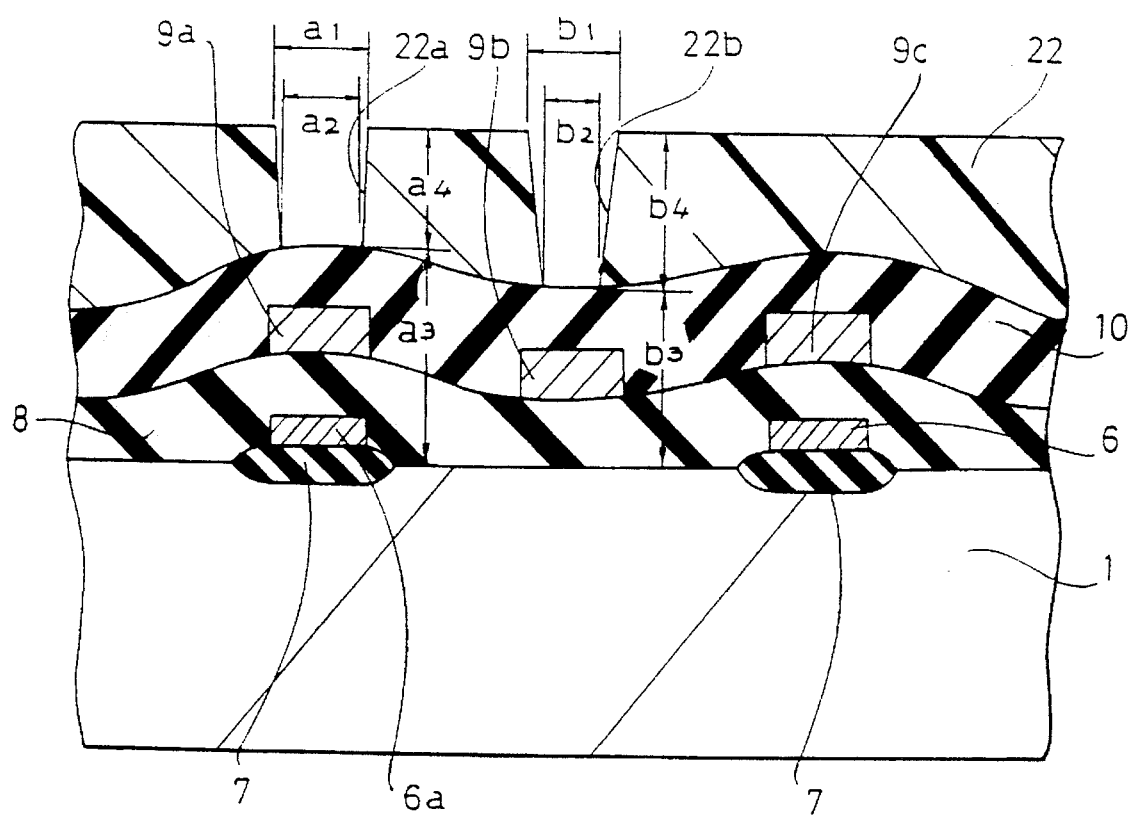
FIG. 18 is a diagram for illustrating a problem in the conventional method of fabricating a semiconductor device.
Figure 19:
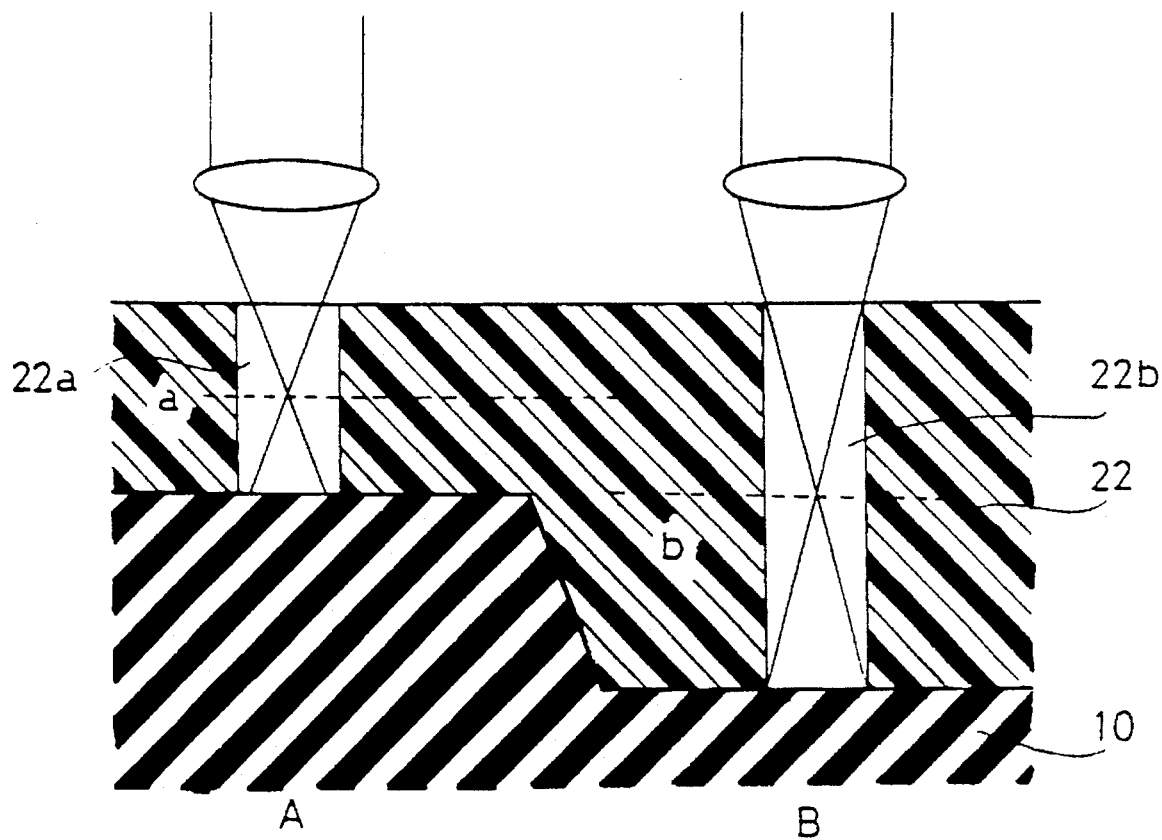
FIG. 19 is a first diagram for illustrating lithography.
Figure 20:
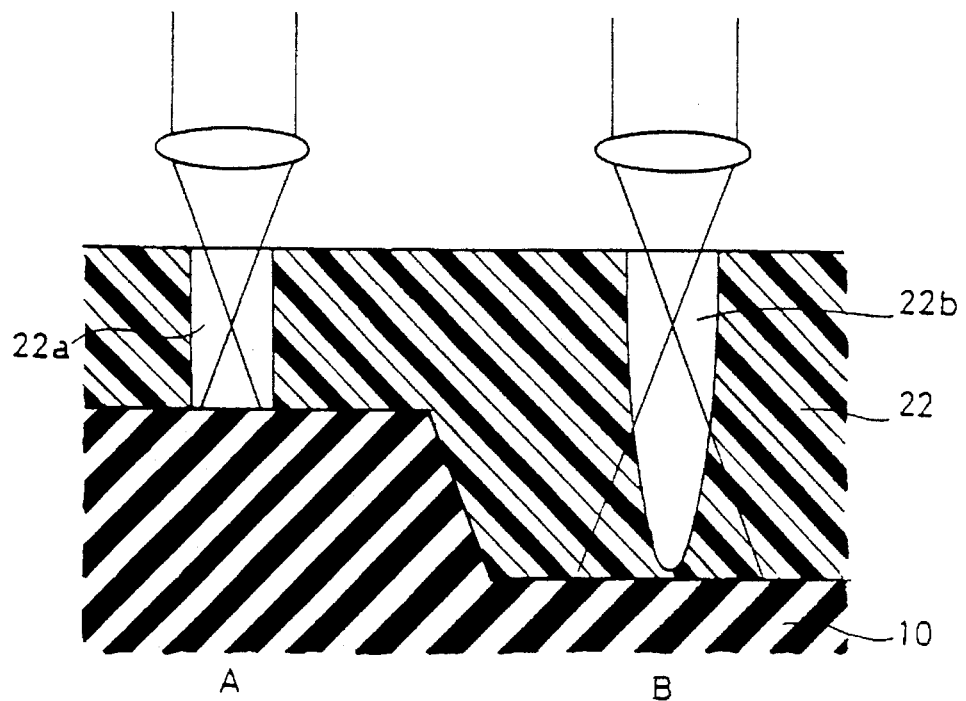
FIG. 20 is a second diagram for illustrating lithography.
Figure 21:
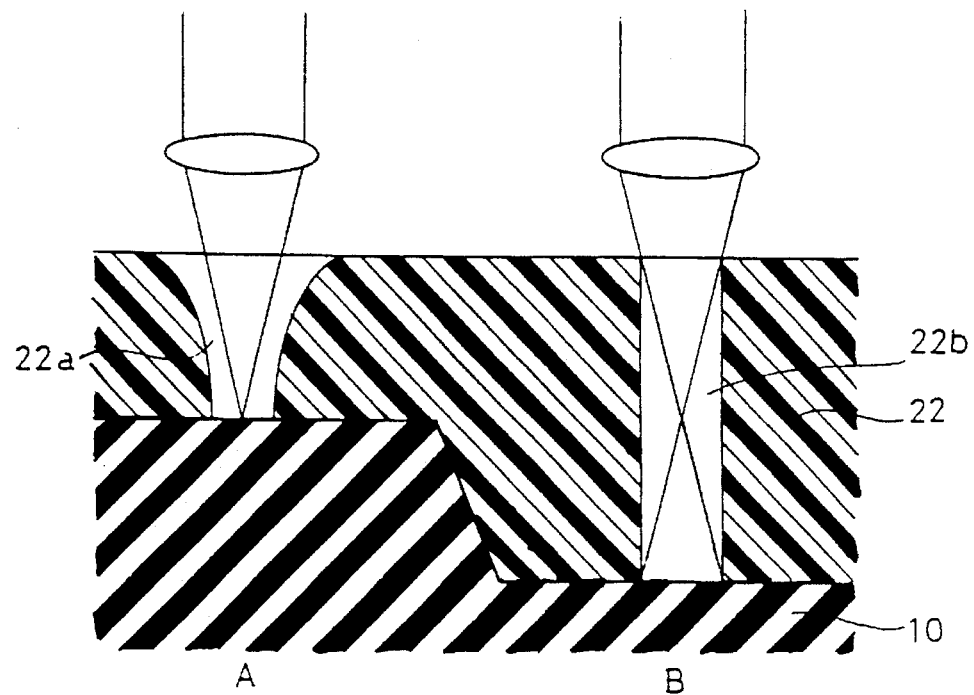
FIG. 21 is a third diagram for illustrating lithography.
Figure 22:
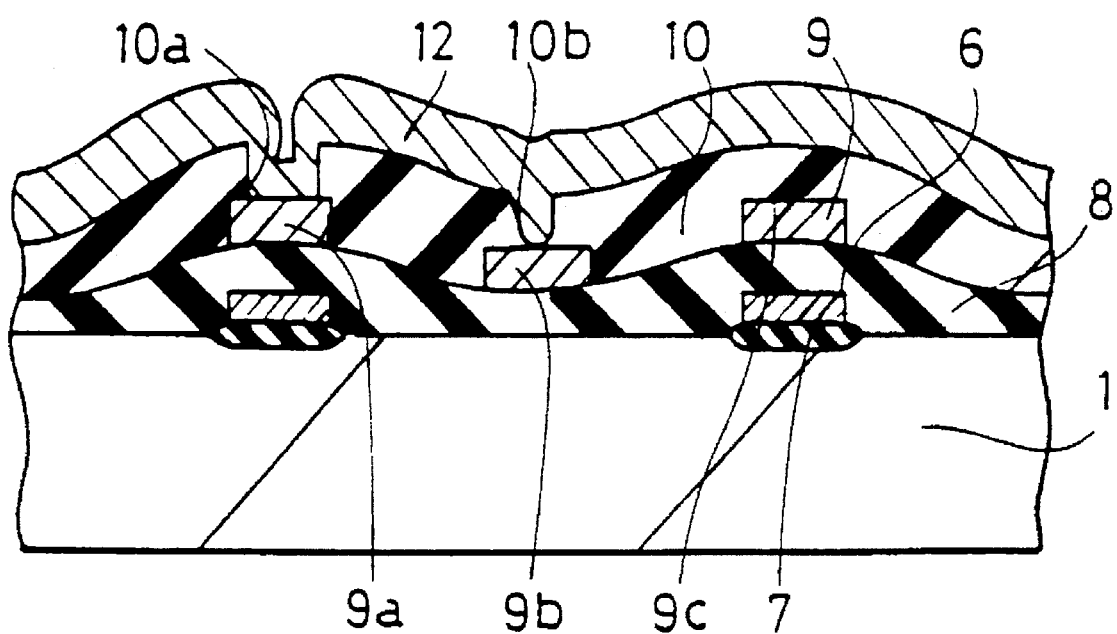
FIG. 22 is a diagram for illustrating a problem of a conventional semiconductor device.

In the embodiment shown in FIG. 11, parts identical to those shown in FIG. 1 are denoted by the same reference numerals, to omit redundant description. Referring to FIG. 11, numeral 51 denotes a third interlayer insulating film, numeral 52 denotes a silicon ladder resin film, and numeral 54 denotes a third aluminum interconnection layer.

In the semiconductor device according to the first aspect of the present invention, as hereinabove described, the first and second via holes have constant diameters. Consequently, the second interconnection layer accurately fills up these via holes, to provide a highly reliable semiconductor device.

In the method of fabricating a semiconductor device according to the second aspect of the present invention, the surface of the interlayer insulating film is flattened by the silicon ladder resin film having excellent flattening ability. The silicon ladder resin film is formed on the interlayer insulating film in a large thickness to sufficiently flatten its surfacer since the film causes no cracking even if its thickness is increased. Further, the first and second via holes can be formed in the interlayer insulating film with constant diameters. Thus, it is possible to provide a highly reliable semiconductor device having a multilayer interconnection structure.

In the method of fabricating a semiconductor device according to the third aspect of the present invention, the silicon ladder resin film is removed before formation of the second interconnection layer. Thus, the first and second via holes have substantially uniform depths and hence the second interconnection layer can be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

a first interconnection layer being provided on said semiconductor substrate;

an interlayer insulating film being provided on said first interconnection layer;

a film of silicon ladder resin being applied on said interlayer insulating film and not in contact with the first interconnection layer, said silicon ladder resin being expressed in the following general formula:

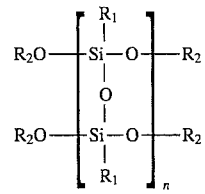

wherein each $R_1$ is individually selected from the group consisting of phenyl radicals and lower alkyl radicals, and each $R_2$ is individually selected from the group consisting of hydrogen atoms and lower alkyl radicals;

via holes being provided through said silicon ladder resin film and said interlayer insulating film; and a second interconnection layer being provided on said silicon ladder resin layer and connected with said first interconnection layer through said via holes.

2. A semiconductor device in accordance with claim 1, wherein distances between upper end portions of said via holes and a major surface of said semiconductor substrate are substantially equal to each other.

3. A semiconductor device in accordance with claim 1, wherein the via holes are substantially equal in diameter with one another.

4. A semiconductor device in accordance with claim 1, wherein the interconnection layers are formed of a material selected from the group consisting of aluminum, tungsten, titanium, molybdenum, tungsten silicide, titanium silicide, molybdenum silicide and polycrystalline silicon material.

5. A semiconductor device in accordance with claim 1, wherein the silicon ladder resin is prepared from a compound selected from the group consisting of polyphenylene silsesquioxane, polyphenylvinyl silsesquioxane, polyphenylmethyl silsesquioxane, polymethylvinyl silsesquioxane, polymethyl silsesquioxane, polyvinyl silsesquioxane, and polyallyl silsesquioxane.

6. A semiconductor device in accordance with claim 1, wherein n is an integer of 20 to 1000.

7. A semiconductor device comprising:

a semiconductor substrate having p-type and n-type major surfaces;

a p-channel transistor being provided on said p-type major surface;

a n-channel transistor being provided on said n-type major surface;

a first interconnection layer being provided over said semiconductor substrate for connecting said p-channel and n-channel transistors with each other;

an interlayer insulating film being provided on said first interconnection layer;

a film of silicon ladder resin being applied on said interlayer insulating film, said silicon ladder resin being expressed in the following general formula:

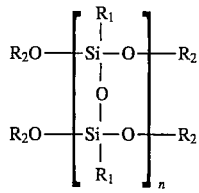

wherein each $R_1$ is individually selected from the group consisting of phenyl radicals and lower alkyl radicals, and each $R_2$ is individually selected from the group consisting of hydrogen atoms and lower alkyl radicals;

via holes being provided through said silicon ladder resin film and said interlayer insulating film; and a second interconnection layer being provided on said silicon ladder resin layer and connected with said first interconnection layer through said via holes.

8. A semiconductor device in accordance with claim 7, wherein distances between upper end portions of said via holes and said major surface of said semiconductor substrate are substantially equal to each other.

9. A semiconductor device in accordance with claim 7, wherein the via holes are substantially equal in diameter with one another.

10. A semiconductor device in accordance with claim 7, wherein the interconnection layers are formed of a material selected from the group consisting of aluminum, tungsten, titanium, molybdenum, tungsten silicide, titanium silicide, molybdenum silicide and polycrystalline silicon material.

11. A semiconductor device in accordance with claim 7, wherein the silicon ladder resin is prepared from a compound selected from the group consisting of polyphenylene silsesquioxane, polyphenylvinyl silsesquioxane, polyphenylmethyl silsesquioxane, polymethylvinyl silsesquioxane, polymethyl silsesquioxane, polyvinyl silsesquioxane, and polyallyl silsesquioxane.

12. A semiconductor device in accordance with claim 7, wherein n is an integer of 20 to 1000.

13. A semiconductor device comprising:

a semiconductor substrate;

a first interconnection layer being provided on said semiconductor substrate;

an interlayer insulating film being provided on said first interconnection layer;

a film of silicon ladder resin being applied on said interlayer insulating film and not in contact with the first interconnection layer, said silicon ladder resin being expressed in the following general formula:

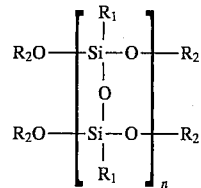

wherein each $R_1$ is individually selected from the group consisting of phenyl radicals and lower alkyl radicals, and each $R_2$ is individually selected from the group consisting of hydrogen atoms and lower alkyl radicals; and a second interconnection layer provided on said silicon ladder resin layer.

14. A semiconductor device in accordance with claim 13, wherein the interconnection layers are formed of a material selected from the group consisting of aluminum, tungsten, titanium, molybdenum, tungsten silicide, titanium silicide, molybdenum silicide and polycrystalline silicon material.

15. A semiconductor device in accordance with claim 13, wherein the silicon ladder resin is prepared from a compound selected from the group consisting of polyphenylene silsesquioxane, polyphenylvinyl silsesquioxane, polyphenylmethyl silsesquioxane, polymethylvinyl silsesquioxane, polymethyl silsesquioxane, polyvinyl silsesquioxane, and polyallyl silsesquioxane.

16. A semiconductor device in accordance with claim 13, wherein n is an integer of 20 to 1000.

* * * * *